(12) United States Patent
Miwa

(10) Patent No.: US 7,379,251 B2
(45) Date of Patent: May 27, 2008

(54) OPTICAL ELEMENT, OPTICAL SYSTEM, LASER DEVICE, EXPOSURE DEVICE, MASK TESTING DEVICE AND HIGH POLYMER CRYSTAL PROCESSING DEVICE

(75) Inventor: Satoshi Miwa, Kawaguchi (JP)

(73) Assignee: Nikon Corporation, Tokyo (JP)

( * ) Notice: Subject to any disclaimer, the term of this patent is extended or adjusted under 35 U.S.C. 154(b) by 436 days.

(21) Appl. No.: 11/226,742

(22) Filed: Sep. 14, 2005

(65) Prior Publication Data

US 2006/0078012 A1 Apr. 13, 2006

Related U.S. Application Data

(63) Continuation of application No. PCT/JP2004/003820, filed on Mar. 22, 2004.

(30) Foreign Application Priority Data

Mar. 24, 2003 (JP) ............................ 2003-079492

(51) Int. Cl.
 G02B 3/06 (2006.01)
 G02B 7/02 (2006.01)
(52) U.S. Cl. ..................................... 359/710; 359/813
(58) Field of Classification Search ................ 359/710, 359/793, 813
 See application file for complete search history.

(56) References Cited

U.S. PATENT DOCUMENTS 5,016,964 A * 5/1991 Donnelly .................... 385/119

5,912,725 A 6/1999 Tanitsu

FOREIGN PATENT DOCUMENTS

| JP | 4-32446 B2 | 5/1992 |
|---|---|---|
| JP | 7-50442 A | 2/1995 |
| JP | 2001-353176 A | 12/2001 |

\* cited by examiner

Primary Examiner—William C Choi
(74) Attorney, Agent, or Firm—Frishauf, Holtz, Goodman & Chick, P.C.

(57) ABSTRACT

The generatrix directions of cylindrical lenses 11a and 11b are perpendicular to the optical axis, and are perpendicular to each other. As a result, the optical system combining the cylindrical lenses 11a and 11b can achieve the same optical effect as a spherical lens. This system is characterized by the fact that since the respective lenses are cylindrical lenses, there is no shift in the optical axis even if the lenses are moved in the generatrix direction. For example, in cases where scratches on the lenses have become conspicuous, the useful life of the laser device can be extended by moving the lenses in the generatrix direction (direction indicated by the arrow) by means of a moving mechanism (not shown in the figures), e.g., a stage equipped with a micrometer, and using unused portions of the lenses.

18 Claims, 12 Drawing Sheets

(a)

(b)

OPTICAL ELEMENT, OPTICAL SYSTEM, LASER DEVICE, EXPOSURE DEVICE, MASK TESTING DEVICE AND HIGH POLYMER CRYSTAL PROCESSING DEVICE

This is a continuation from PCT International Application No. PCT/JP2004/003820 filed on Mar. 22, 2004, which is hereby incorporated.

TECHNICAL FIELD

The present invention relates to an optical element and optical system which have a lens effect mainly with respect to light in the ultraviolet region, and further relates to a laser device, exposure apparatus, mask inspection device and macromolecular crystal working apparatus which have this optical element and optical system.

BACKGROUND ART

In recent years, laser light has been used in various applications; for example, such light is used for cutting and working metals, is used as a light source for photolithographic devices in semiconductor manufacturing apparatuses, and is also used in various types of measuring devices, and in procedures and treatment devices used in surgery, ophthalmology, dentistry, and the like. In particular, laser light has recently come to be used in the irradiation of the cornea in order to perform ablation of the surface of the cornea (PRK) or ablation of the interior of the surgically opened cornea (LASIK), and the performance of therapy for nearsightedness, farsightedness and astigmatism by correcting the curvature and irregular indentations and projections of the cornea has attracted attention, and has begun to be adapted for practical use in some cases. Devices which perform ablation of the surface of the cornea by irradiating the cornea with ArF excimer laser light (wavelength: 193 nm) have been known as such corneal treatment devices.

However, ArF excimer laser oscillators are constructed with argon gas, fluorine gas, neon gas or the like sealed inside the chamber, so that tight sealing of these gases is required. Furthermore, filling and recover of the respective gases must also be performed, so that the problem of increased size and complexity of the apparatus is encountered. Moreover, in the case of an ArF excimer laser oscillator, the following problem also arises: namely, periodic replacement of the internal gas or an overhaul of the apparatus is required in order to maintain a predetermined laser light generating performance.

Accordingly, it is desirable to use a solid-state laser instead of such a gas laser as a laser light source. However, the wavelength of the laser light emitted from a solid-state laser is ordinarily longer than the wavelength described above, so that such solid-state lasers are not suited for use in (for example) corneal treatment devices. Therefore, a method has been developed in which long-wavelength light emitted from such a solid-state laser is used after being converted into short-wavelength ultraviolet light (e.g., an eighth wave) by using a nonlinear optical crystal. For example, such a technique is described in Japanese Patent Application Kokai No. 2001-353176. LBO crystals, SBBO crystals, and the like are known as nonlinear optical elements that are used for such purposes.

In such wavelength conversion optical systems, the laser light from the laser light source constituting the fundamental wave is focused using a focusing lens, and is caused to be incident on a nonlinear optical element. In cases where the phase matching conditions are satisfied, the intensity of the laser light that is produced by wavelength conversion is proportional to the square of the intensity of the fundamental wave; accordingly, it is particularly essential that the intensity of the output light be increased by using a focusing lens to focus the light. The laser light produced by wavelength conversion using a nonlinear optical element is shaped into a desired beam shape by means of a lens in accordance with the intended use.

Meanwhile, fuzed silica glass is widely used as a material for lenses used in the ultraviolet region for reasons such as the fact that such glass has a superior transmissivity in the ultraviolet region, and the thermal expansion coefficient of such glass is extremely small, so that the glass has superior temperature stability.

Fuzed silica glass has such superior characteristics as those described above in the ultraviolet region; however, it has been ascertained that such glass is damaged by irradiation with ultraviolet laser light, for example, at a wavelength of 248 nm or 193 nm.

Accordingly, the following problem has been encountered: namely, lenses made of a fuzed silica glass must be replaced at predetermined intervals of use. As a countermeasure in this case, it is conceivable that the useful life might be extended by shifting the lens so that unused portions are newly used, thus avoiding portions that have been subjected to damage. In this case, however, the following problem arises: namely, the optical axis is shifted.

The present invention was devised in light of such circumstances; it is an object of the present invention to provide an optical element and optical system that can be used over a long period of time even in cases where this element and system are formed from a material whose performance is caused to be damaged by the light that is used, and also to provide a laser device, exposure apparatus, mask inspection device and macromolecular crystal working apparatus using this optical element and optical system.

DISCLOSURE OF THE INVENTION

The first invention that is used to achieve the object described above is an optical element comprising a plurality of cylindrical lenses, wherein these cylindrical lenses are disposed so that the generatrix directions of these lenses cross each other, and the respective lenses are made movable in the respective generatrix directions.

In this invention, a plurality of cylindrical lenses are used in combination so that the generatrix directions of these cylindrical lenses cross each other. Specifically, the same operation as that of a single lens is achieved by means of a plurality of cylindrical lenses. These cylindrical lenses are made movable in the respective generatrix directions of these lenses.

Even if the cylindrical lenses are moved in the generatrix direction, the characteristics of these lenses as lenses remain unchanged. Accordingly, in cases where the portion of such a lens that receives the light that is used is damaged, the cylindrical lens can be caused to receive light in a different location by moving the lens in the generatrix direction. If the cylindrical lenses are formed with a long length, the useful life can be extended by thus successively using fresh portions of the lenses. Especially in cases where materials that are easily caused to be damaded by the light that is used are employed as the materials of the lenses, the effect of the present invention is great.

The second invention that is used to achieve the object described above is the first invention, wherein there are two cylindrical lenses, and the generatrix directions of these lenses are perpendicular to each other.

By causing the generatrix directions of two cylindrical lenses to be perpendicular to each other, it is possible to provide the lenses with characteristics similar to those of ordinary lenses. In particular, if these two cylindrical lenses are formed as lenses of the same material and same shape, it is possible to give a function similar to that of an ordinary spherical convex lens or spherical concave lens.

The third invention that is used to achieve the object described above is the first invention or second invention, wherein the material that forms the cylindrical lenses is fuzed silica glass or calcium fluoride.

As was described above, fuzed silica glass that is used in the ultraviolet light region has the property of being susceptible to damage by ultraviolet light. Since this weak point is overcome by the first and second inventions described above, a long useful life can be obtained even if fuzed silica glass is used in the ultraviolet light region, so that the strong points of fuzed silica glass can be used to good advantage. The same is true in cases where the cylindrical lenses are formed from calcium fluoride.

The fourth invention that is used to achieve the object described above is an optical system comprising a control device that detects the light that is transmitted through the optical element of any of the first through third inventions described above, and that moves the cylindrical lenses by a predetermined distance in the respective generatrix directions when the detected value is equal to or less than a predetermined value.

In this invention, the system is devised so that the intensity of the light transmitted through the optical element is measured, and when the intensity of this light is equal to or less than a predetermined value, the cylindrical lenses are moved by a predetermined distance in the respective generatrix directions of the lenses; accordingly, the intensity of the light that is transmitted through the optical element can always be maintained at a predetermined value or greater. Furthermore, the intensity of the light, the power of the light, or the like may be cited as examples of the detected value of the light; however, the present invention is not limited to this.

The fifth invention that is used to achieve the object described above is an optical system comprising a control device that moves the cylindrical lenses by a predetermined distance in the respective generatrix directions each time that the time for which the optical element according to any of the first through third inventions is used passes a predetermined time.

In this invention, the system is devised so that the cylindrical lenses are moved by a predetermined distance in the respective generatrix directions each time that the time for which the optical element is used passes a predetermined time. Accordingly, as in the fourth invention, the intensity of the light transmitted through the optical element can always be maintained at a predetermined value or greater.

The sixth invention that is used to achieve the object described above is an optical system comprising a control device that continuously moves the cylindrical lenses in the respective generatrix directions in accordance with the time that the optical element according to any of the first through third inventions is used.

In this invention, since the system is devised so that the cylindrical lenses are continuously moved in the respective generatrix directions in accordance with the time for which the optical element is used, the intensity of the light that is transmitted through the optical element can always be maintained at a predetermined value or greater, as in the fifth invention.

The seventh invention that is used to achieve the object described above is a laser device comprising a laser light source and a wavelength conversion element that converts the wavelength of the laser light that is output from this laser light source, wherein this laser device has a function whereby laser light is focused on the wavelength conversion element by means of the optical element according to any of the first through third inventions, or by means of the optical system according to any of the fourth through sixth inventions.

As was described above, in a laser device which uses a wavelength conversion element to convert the wavelength of laser light emitted from (for example) a solid-state laser, it is essential that the intensity of the light that is incident on the wavelength conversion element be increased by constricting this light. Accordingly, in such a laser device, the intensity of the laser light that is subjected to wavelength conversion can be increased by focusing the laser light on the wavelength conversion element by means of the optical element according to any of the first through third inventions or the optical system according to any of the fourth through sixth inventions.

The eighth invention that is used to achieve the object described above is an exposure apparatus comprising the laser device according to the seventh invention, a mask supporting part that holds a photo-mask on which a predetermined exposure pattern is formed, an object holding part that holds the object of exposure, an illumination optical system that illuminates the photo-mask held by the mask supporting part with ultraviolet light that is emitted from the laser device, and a projection optical system that illuminates the object of exposure held by the object holding part with the illuminating light that has passed through the photo-mask after illuminating this photo-mask via the illumination optical system.

The ninth invention that is used to achieve the object described above is a mask defect inspection device comprising the laser device according to the seventh invention, a mask supporting part that holds a photo-mask on which a predetermined pattern is formed, a detector that detects a projected image of the pattern, an illumination optical system that illuminates the photo-mask held by the mask supporting part with ultraviolet light that is emitted from the laser device, and a projection optical system that projects onto the detector the illuminating light which has passed through the photo-mask after illuminating this photo-mask via the illumination optical system.

The tenth invention that is used to achieve the object described above is a macromolecular crystal working apparatus which works a macromolecular crystal, wherein this apparatus comprises the laser device according to the seventh invention, an optical system which conducts laser light that is emitted from this laser device to the macromolecular crystal that is the object of working, and focuses this laser light on the working site of this macromolecular crystal, and a mechanism which varies the relative positions of the optical system and the macromolecular crystal.

The eleventh invention that is used to achieve the object described above is the tenth invention, wherein this apparatus further comprises an observation device that simultaneously observes the position where the laser light is focused and the macromolecular crystal, or a measurement device that simultaneously measures the position where the laser light is focused and the macromolecular crystal.

The twelfth invention that is used to achieve the object described above is the eleventh invention, wherein the observation device or measurement device is an optical observation device or optical measurement device using visible light, this observation device or measurement device is in a fixed mechanical relationship with the optical system, the reference point of the observation device or measurement device and the position where the laser light is focused coincide, and this apparatus has the function of indirectly observing or measuring the position where the laser light is focused by observing or measuring the position of the reference point of the observation device or measurement device.

BEST MODE FOR CARRYING OUT THE INVENTION

Figure 1:
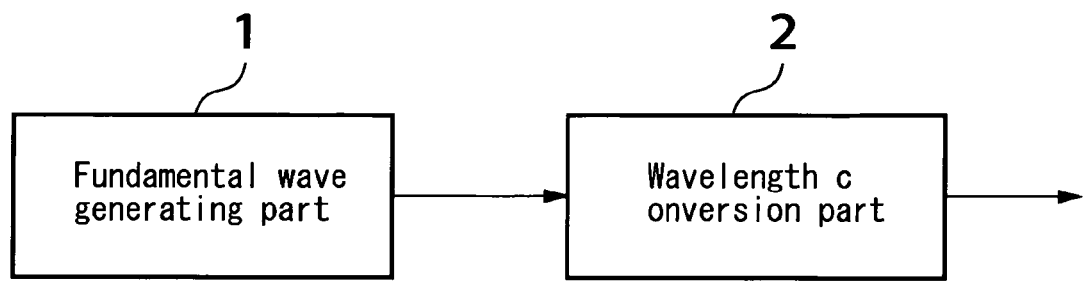
FIG. 1 is an overall structural diagram of a laser device constituting a first embodiment of the present invention, this laser device being a device that outputs laser light emitted from a solid-state laser after this laser light has been subjected to a wavelength conversion.

Embodiments of the present invention will be described below with reference to the figures. FIG. 1 shows a laser device constituting a first embodiment of the present invention; this is a diagram showing the overall construction of a device that outputs laser light emitted from a solid-state laser after subjecting this laser light to a wavelength conversion. Specifically, this laser device is constructed from a fundamental wave generating part 1 and a wavelength conversion part 2.

Figure 2:
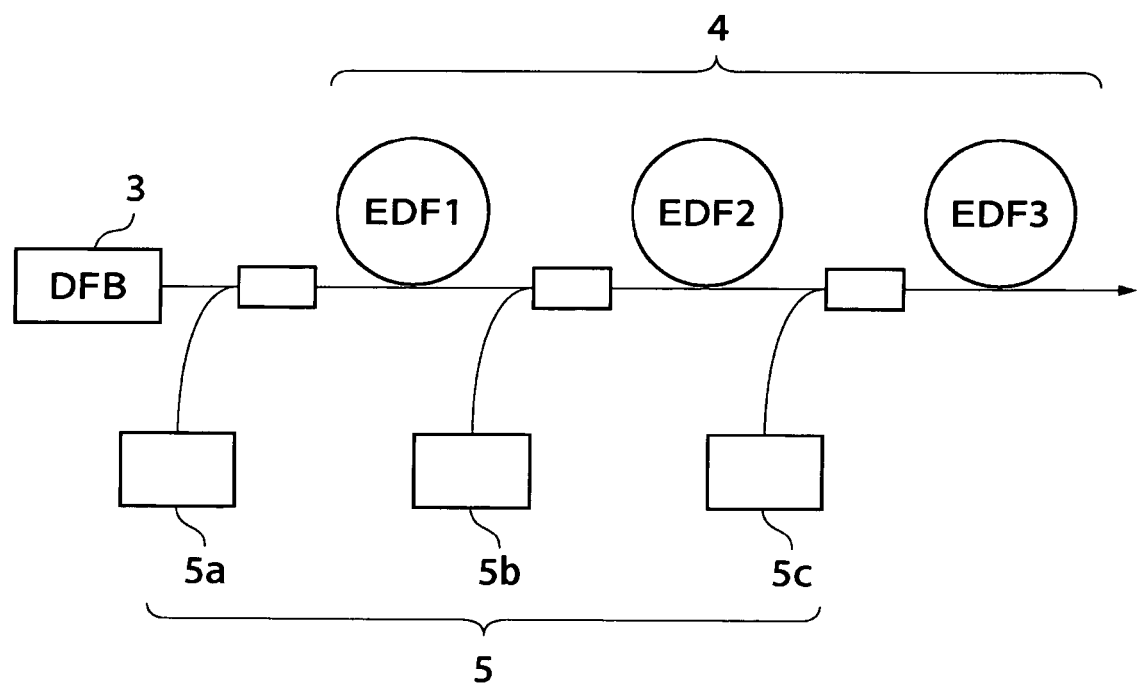
FIG. 2 is a diagram showing the schematic construction of the fundamental wave generating part.

FIG. 2 is a diagram showing the schematic construction of the fundamental wave generating part 1.

The laser light source that generates the fundamental wave uses an optical amplifier including an erbium doped fiber (EDF), and is constructed mainly from a light source part 3, an EDF part 4, and an excitation light source part 5. Pulsed light with a wavelength of 1547 nm is output from a DFB constituting the light source of the light source part 3, and is amplified by the EDF part 4. The EDF part 4 is constructed from an EDF with three stages, i.e., EDF1, EDF2 and EDF3. Excitation light is respectively supplied to these three stages from excitation light sources $5a$, $5b$ and $5c$. The output light from the EDF 3 is input into a wavelength conversion part (described later).

Figure 3:
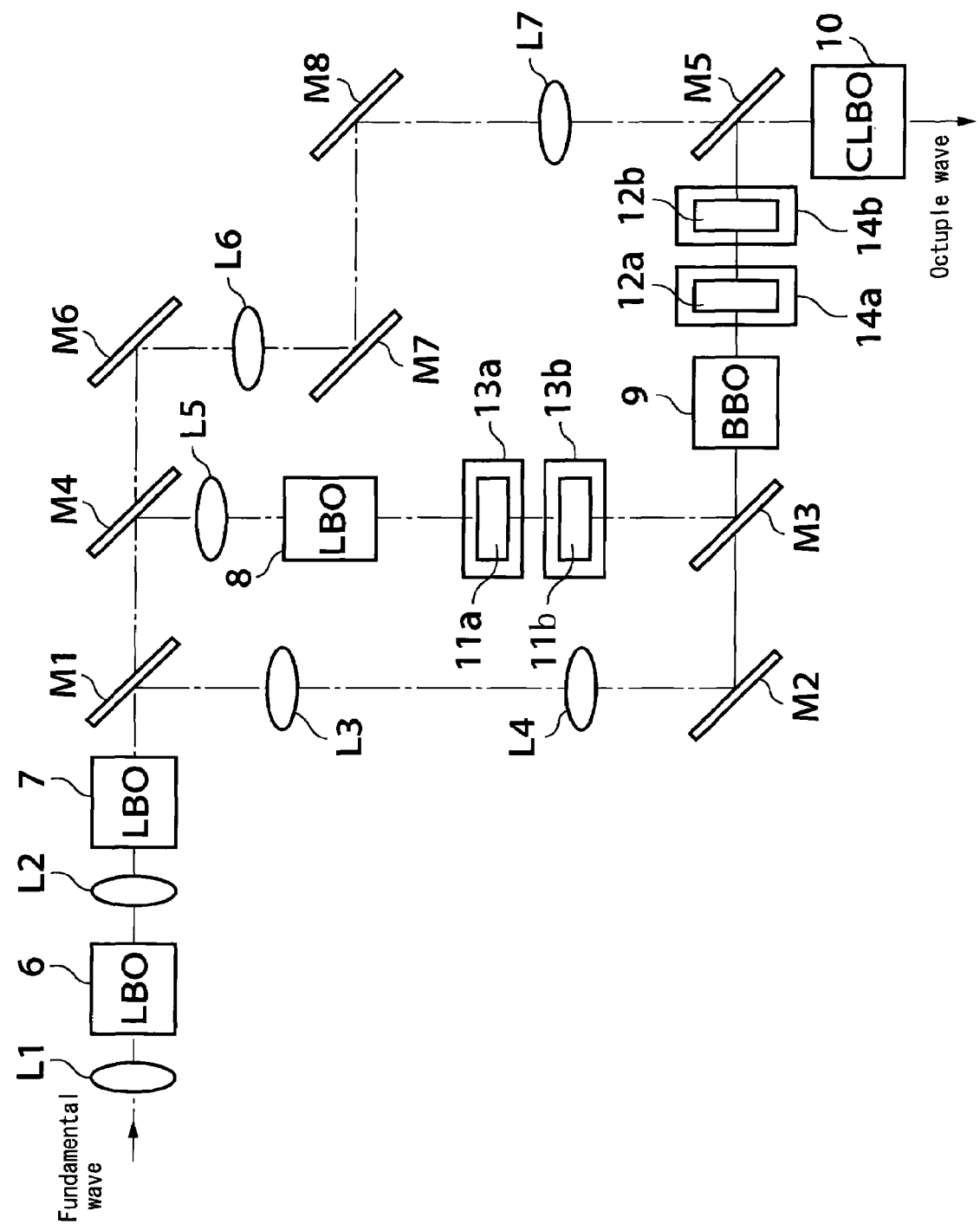
FIG. 3 is a diagram showing the schematic construction of the wavelength conversion part.

FIG. 3 is a diagram which shows the schematic construction of the wavelength conversion part 2. The wavelength conversion part 2 performs a wavelength conversion of the laser light with a wavelength of 1547 nm that is output from the fundamental wave generating part 1. The wavelength conversion part 2 is provided with a plurality of wavelength conversion means, i.e., the following respective higher harmonic wave generating parts: namely, a second wave generating part 6, third wave generating part 7, fourth wave generating part 8, seventh wave generating part 9 and eighth wave generating part 10. Optical elements that are used to propagate the higher harmonic waves to the next higher harmonic wave generating part are disposed between the respective higher harmonic wave generating parts.

In this embodiment, all of the respective higher harmonic wave generating parts use nonlinear optical crystals. In concrete terms, an $LiB_3O_5$ (LBO) crystal is used for the second wave generating part 6, third wave generating part 7 and fourth wave generating part 8, a $\beta\text{-}BaB_2O_4$ (BBO) crystal is used for the seventh wave generating part 9, and a $CsLiB_6O_{10}$ (CLBO) crystal is used for the eighth wave generating part 10. This second wave generating part 6, third wave generating part 7, fourth wave generating part 8, seventh wave generating part 9 and eighth wave generating part 10 generate light at respective wavelengths of 773 nm, 516 nm, 387 nm, 221 nm and 193 nm.

Specifically, the incident laser light with a wavelength of 1547 nm is focused by the lens L1, and is caused to be incident on the second wave generating part 6. Light with a doubled frequency (second wave) is output from the second wave generating part 6 along with this fundamental wave. These light beams are focused by the lens L2, and enter the third wave generating part 7, where the light beams are combined. Then, light with a frequency that is three times that of the fundamental wave (i.e., a third wave) is output along with the fundamental wave and second wave. Of these waves, the third wave is reflected by the dichroic mirror M1, then passes through the lenses L3 and L4 and is reflected by the reflective mirror M2, then passes through the dichroic mirror M3, and is then combined with light having a frequency that is four times that of the fundamental wave (fourth wave; described later). The system is arranged so that the lenses L3 and L4 focus the third wave on the seventh wave generating part 9.

Of the fundamental wave and second wave passing through the dichroic mirror M1, the second wave is reflected by the dichroic mirror M4, and is then focused by the lens L5, so that this wave is incident on the fourth wave generating part 8. Then, a fourth wave is output from the fourth wave generating part 8 along with the second wave.

As was described above, the wavelength of the fourth wave is 387 nm, so that this light is ultraviolet light. Accordingly, fuzed silica glass is used for the lens. However, as was described in the section on the prior art, this glass is susceptible to damage; accordingly, an optical element is used which is provided with the effect of a single lens by combining two cylindrical lenses 11a and 11b constituting an embodiment of the present invention. This optical element is designed to focus the fourth wave that is output from the fourth wave generating part 8 on the seventh wave generating part 9. Specifically, the fourth wave is reflected by the dichroic mirror M3, combined with the third wave described above, and input into the seventh wave generating part 9. Accordingly, light which has a frequency that is seven times that of the fundamental wave (i.e., a seventh wave) is output from the seventh wave generating part 9 along with the third wave and fourth wave.

These light beams pass through an optical element which is provided with the effect of a single lens by combining two cylindrical lenses 12a and 12b (constituting an embodiment of the present invention), and are input into the dichroic mirror M5; here, only the seventh wave is reflected and input into the eighth wave generating part 10. The optical element combining the two cylindrical lenses 12a and 12b is designed to focus this seventh wave on the eighth wave generating part 10.

The fundamental wave that is transmitted via the dichroic mirror M4 passes through the optical system consisting of the reflective mirrors M6, M7 and M8 and the lenses L6 and L7, and also passes through the dichroic mirror M5; this wave is focused on the eighth wave generating part 10 by the action of the lenses L6 and L7. Accordingly, the fundament wave and the seventh wave are input into the eighth wave generating part 10, and light having a frequency that is eight times that of the fundamental wave (i.e., an eighth wave) is output in addition to the fundamental wave and seventh wave.

Thus, in the wavelength conversion part 2 shown in FIG. 2, ordinary lenses are used for the focusing of the fundamental wave, second wave and third wave, and optical elements combining two cylindrical lenses are used for the focusing of the fourth wave and seventh wave.

These cylindrical lenses 11a, 11b, 12a and 12b are respectively held by holding means 13a, 13b, 14a and 14b; these holding means have structures that allow driving of the respective cylindrical lenses 11a, 11b, 12a and 12b in the respective generatrix directions of these lenses. Furthermore, the generatrix directions of the respective cylindrical lenses 11a, 11b, 12a and 12b are perpendicular to the optical axis, and the generatrix directions of the cylindrical lenses 11a and 11b and the generatrix directions of the cylindrical lenses 12a and 12b are respectively perpendicular to each other. As a result, the optical system combining the cylindrical lenses 11a and 11b and the optical system combining the cylindrical lenses 12a and 12b respectively have the same optical effect as a spherical lens.

Figure 4:
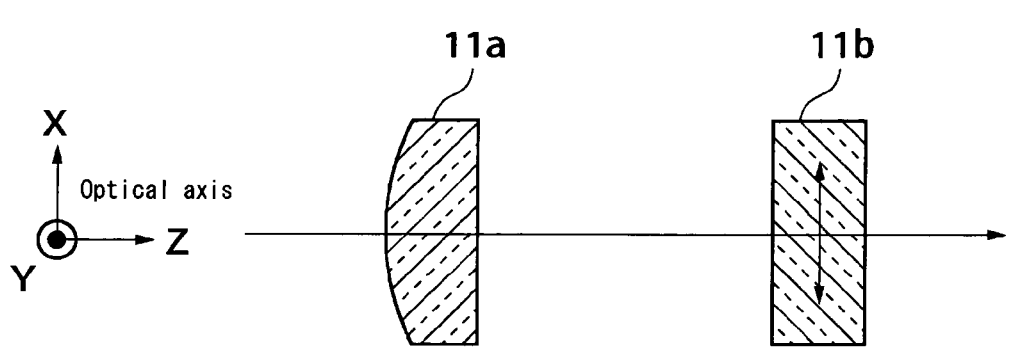
FIG. 4 is a diagram showing an example of the disposition of the cylindrical lenses.
Figure 4:
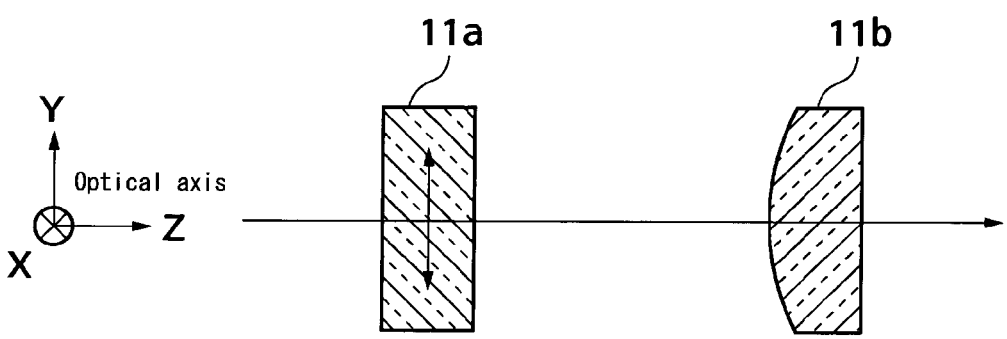

FIG. 4 is a diagram showing an example of the disposition of the cylindrical lenses 11a and 11b. Since the respective lenses are cylindrical lenses, these lenses are characterized by the fact that there is no shift of the optical axis even if the lenses are moved in the generatrix directions. For example, in cases where damage of the lenses has become conspicuous, the useful life of the laser device can be prolonged by moving the lenses in the generatrix direction (direction indicated by the arrow) by means of a moving mechanism not shown in the figures, e.g., a stage equipped with a micrometer, and using unused portions of the lenses. The cylindrical lenses 12a and 12b also have a similar disposition.

Furthermore, in the embodiment described above, fuzed silica glass is used as the material of the respective cylindrical lenses; however, this disposition can also be applied to cases where similar damage is a problem in materials other than fuzed silica glass, (e.g., calcium fluoride). Furthermore, in the embodiment described above, optical elements that combine two cylindrical lenses are used; however, it would also be possible to use optical elements that combine three or more cylindrical lenses.

Figure 5:
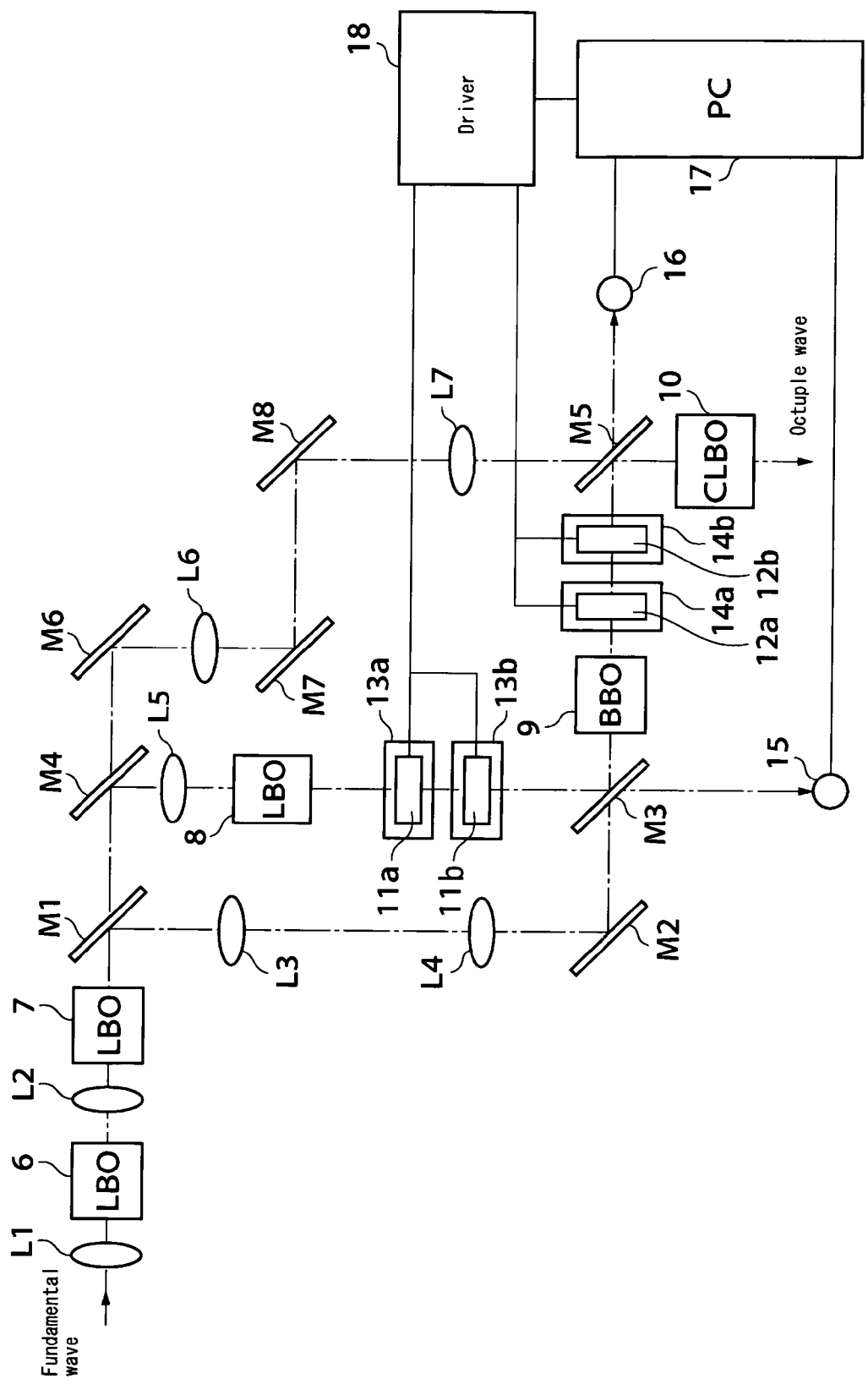
FIG. 5 is a diagram showing the overall construction of a laser device constituting a second embodiment of the present invention.

FIG. 5 is a diagram which illustrates the wavelength conversion part 2 of a second embodiment of the present invention. The wavelength conversion method and the construction of the optical system in this wavelength conversion part 2, as well as the effect itself, are absolutely the same as in the wavelength conversion part shown in FIG. 3; accordingly, the same constituent elements are labeled with the same symbols, and a description of such constituent elements is omitted. This embodiment differs from the embodiment shown in FIG. 3 in that a control mechanism is added which detects the fact that the cylindrical lenses 11a, 11b, 12a and 12b have been damaged so that the light transmissivity has dropped, and positions unused portions of the respective cylindrical lenses in the area of the optical axis.

Specifically, the optical detector 15 detects the intensity of the second wave that has been transmitted through the dichroic mirror M3. Furthermore, the optical detector 16 detects the intensities of the third wave and fourth wave that are transmitted through the dichroic mirror M5. These detected values are input into the control device 17, and are compared with predetermined values. Then, when the output of the optical detector 15 falls below the predetermined value, the control device 17 sends a command to the driver 18, so that the holding means 13a and 13b are driven by a predetermined distance, thus causing portions of the cylindrical lenses 11a and 11b that have not been used until now to be used. Similarly, when the output of the optical detector 16 falls below the predetermined value, the control device 17 sends a command to the driver 18, so that the holding means 14a and 14b are driven by a predetermined distance, thus causing portions of the cylindrical lenses 12a and 12b that have not been used until now to be used. A universally known method such as the carrying of the respective holding means on electrically driven stages can be used to move the respective holding means.

Furthermore, in this embodiment, what is detected by the optical detector 15 is not the fourth wave, and what is detected by the optical detector 16 is not the seventh wave. However, since it would be thought that the light intensities of the respective multiple waves weaken in the same manner when the cylindrical lenses are damaged, this is not particularly a problem. In particular, in cases where it is desired to measure the respective intensities of the fourth wave and seventh wave directly, it would also be possible (for example) to employ a method in which a prism is disposed after the dichroic mirrors M3 and M5, and the fourth wave and seventh wave are separated and measured.

FIGS. 6 through 9 are flow charts which illustrate the basic operation of the control device. The main algorithm will be described with reference to FIG. 6, and the respective detailed processing algorithms within this main algorithm will be described with reference to FIGS. 7 through 9.

Figure 6:
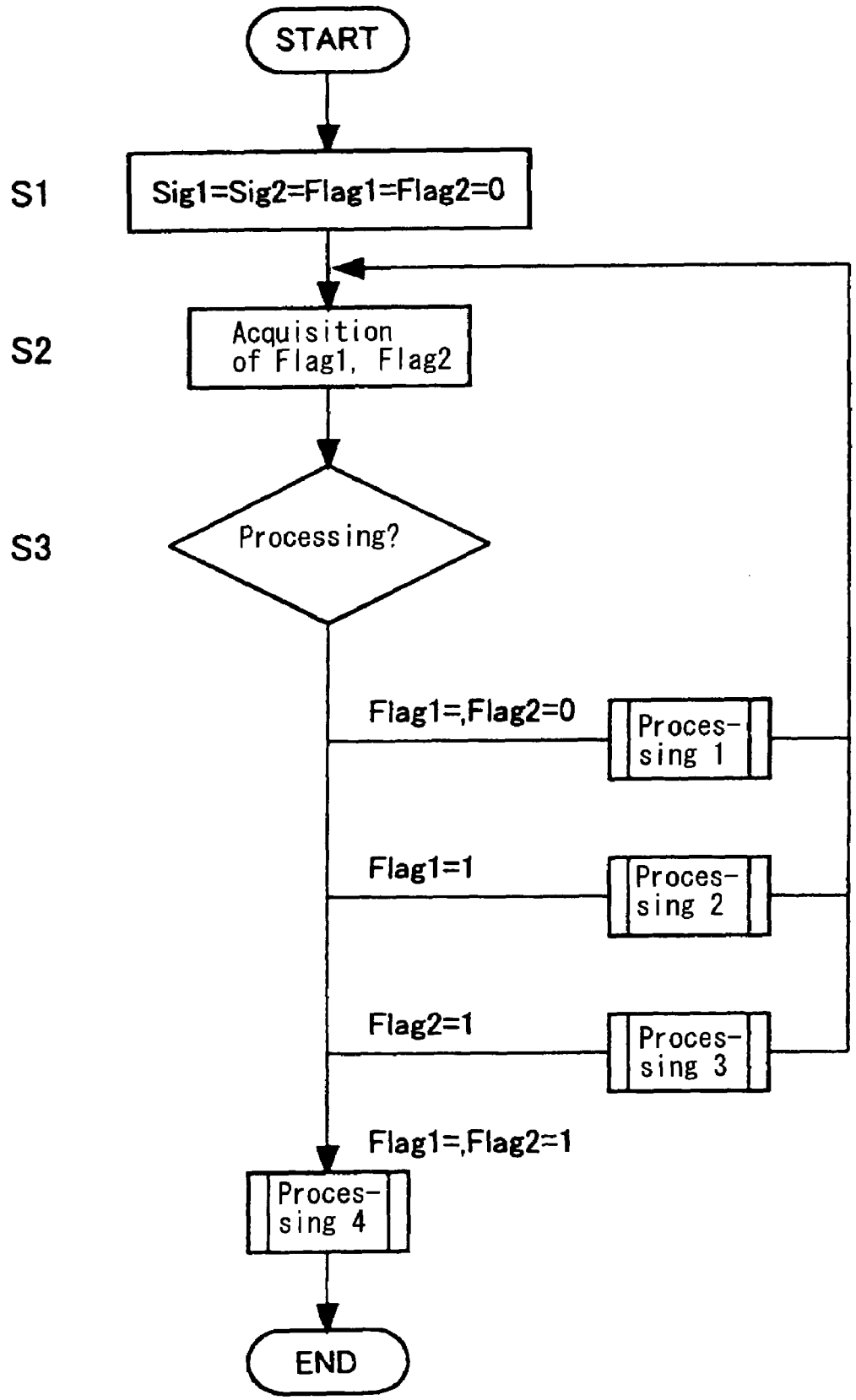
FIG. 6 is a flow chart which illustrates the basic operation of the control device.
Figure 7:
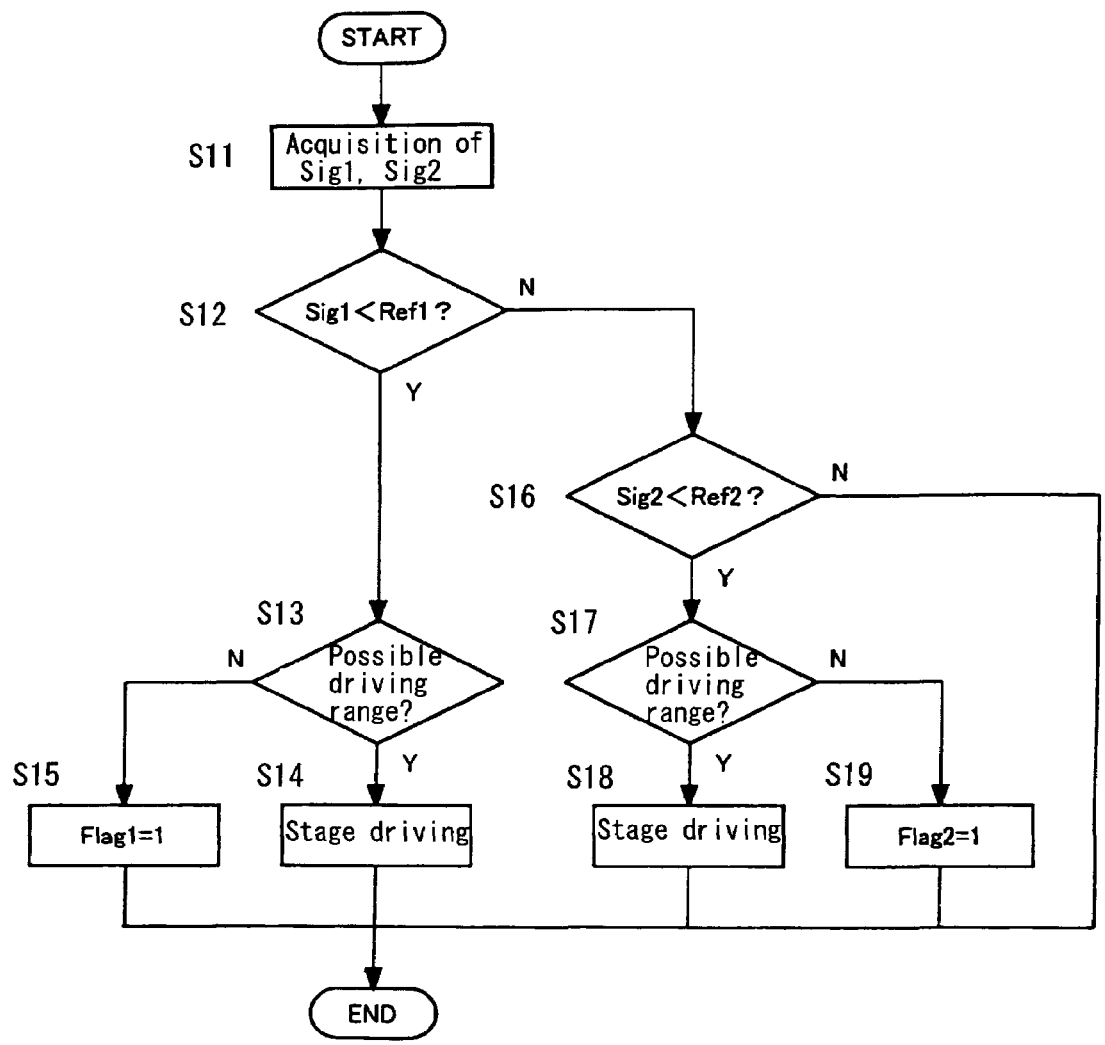
FIG. 7 is a flow chart which shows the algorithm of processing 1 in FIG. 6.

In the main algorithm shown in FIG. 6, processing according to the inside and outside of the possible driving ranges of the respective electrically driven stages is performed. First, in step S1, the initialization of the respective signals Sig1 and Sig2 from the optical detector 15 and optical detector 16, and of the respective flags Flag1 and Flag2 used to ascertain the possible driving ranges of the fourth wave lens holding means 13a and 13b and seventh wave lens holding means 14a and 14b, is performed. Here, in a case where Flag1 and Flag2 are respectively 0, this indicates that the holding means are within the possible driving range. When these flags are 1, this indicates that the holding means are outside the driving range.

Next, in step S2, the values of Flag1 and Flag2 are acquired. Next, in step S3, the conditions of the acquired Flag1 and Flag2 are ascertained. In cases where both Flag1 and Flag2 are 0, the processing returns to S2 after the processing 1 is performed. In cases where only Flag1 is 1, the processing returns to S2 after the processing 2 is performed. In cases where only Flag2 is 1, the processing returns to S2 after the processing 3 is performed. In cases where both Flag1 and Flag2 are 1, the processing is ended after the processing 4 is performed.

In the algorithm of the processing 1 in FIG. 6 (shown in FIG. 7), the signal values Sig1 and Sig2 from the respective detectors 15 and 16 are compared with values Ref1 and Ref2 that are stored beforehand; furthermore, it is ascertained whether these values are inside or outside the possible driving range, and the driving or non-driving of the respective electrically driven stages is performed in accordance with the results obtained.

First, in step S11, the values of Sig1 and Sig2 are acquired. Next, in step S12, Sig1 is compared with the set value Ref1 that is stored beforehand. In cases where Sig1<Ref1, it is ascertained in step S13 whether the value is inside or outside the possible driving range. If the value is inside the possible driving range, the fourth wave lens holding means 13a and 13b are moved by a predetermined distance in S14; after the lenses have been moved, the processing is ended. If the value is outside the possible driving range, Flag1=1 is set in step S15, and the processing is ended.

In cases where Sig1 is not less than Ref1 in step S12, Sig2 is compared in step S16 with the set value Ref2 that is stored beforehand. In cases where Sig2<Ref2, it is ascertained in step S17 whether or not the value is within the possible driving range. If the value is inside the possible driving range, the seventh wave lens holding means 14a and 14b are moved by a predetermined distance in step S18; after the lenses have been moved, the processing is ended. In cases where the value is outside the possible driving range, Flag2=1 is set in step S19, and the processing is ended. In cases where Sig2 is not less than Ref2 in step S16, the processing is ended "as is."

Figure 8:
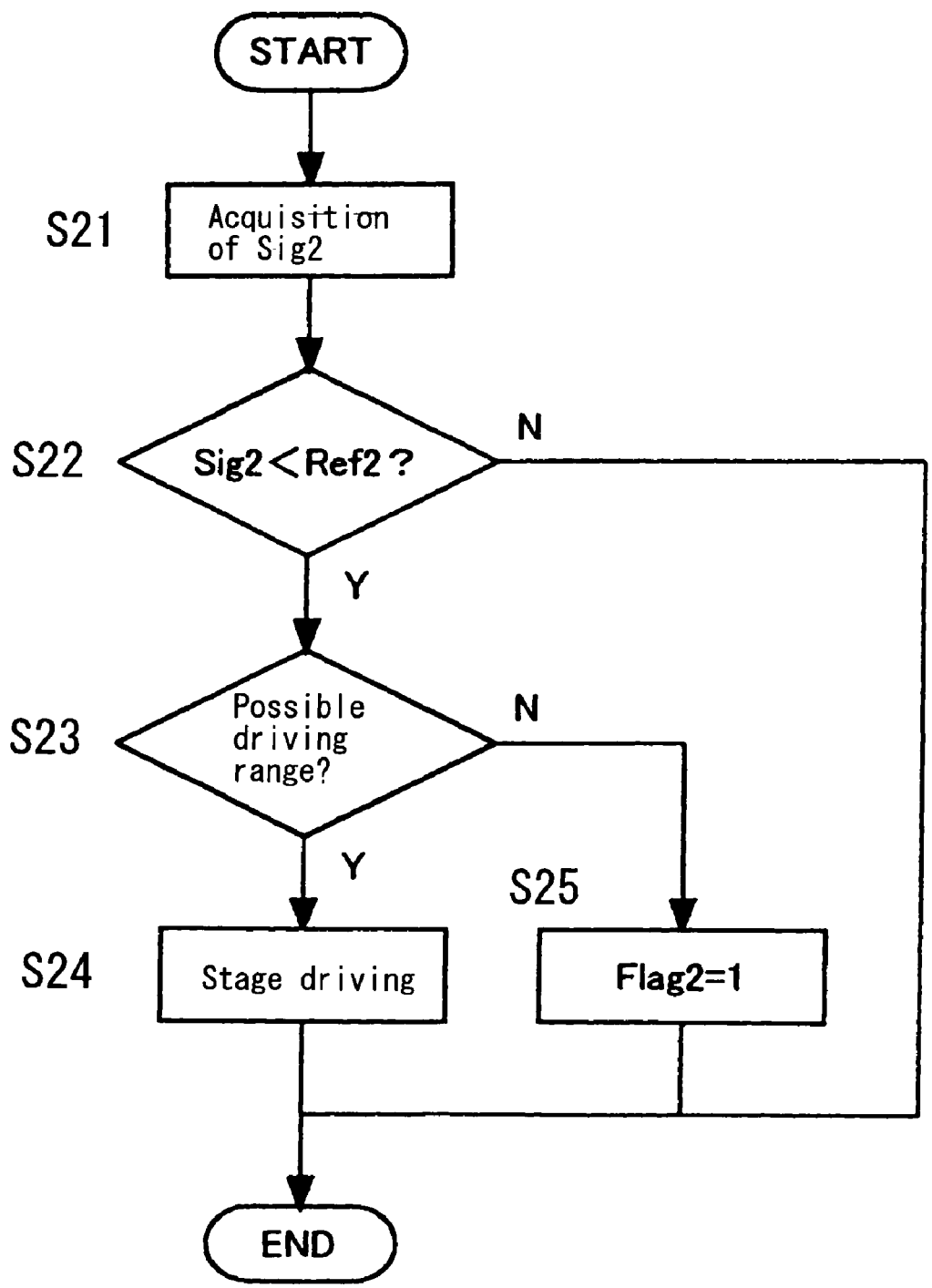
FIG. 8 is a flow chart which shows the algorithm of processing 2 in FIG. 6.

In the algorithm of the processing 2 shown in FIG. 8, the signal value from the optical detector 16 is compared with a value that is stored beforehand, and it is ascertained whether the value is inside or outside the possible driving range. The driving or non-driving of the seventh wave lens holding means 14a and 14b is performed in accordance with the results.

First, in step S21, the value of Sig2 is acquired. Next, in step S22, Sig2 is compared with the set value Ref2 that is stored beforehand. In cases where Sig2<Ref2, it is ascertained in step S23 whether or not the value is inside the possible driving range. If the value is inside the possible driving range, the seventh wave lens holding means 14a and 14b are moved by a predetermined distance in step S24; after the lenses have been moved, the processing is ended. In cases where the value is outside the possible driving range, Flag2=1 is set in step S25, and the processing is ended. In cases where Sig2 is not less than Ref2 in S22, the processing is ended "as is."

Figure 9:
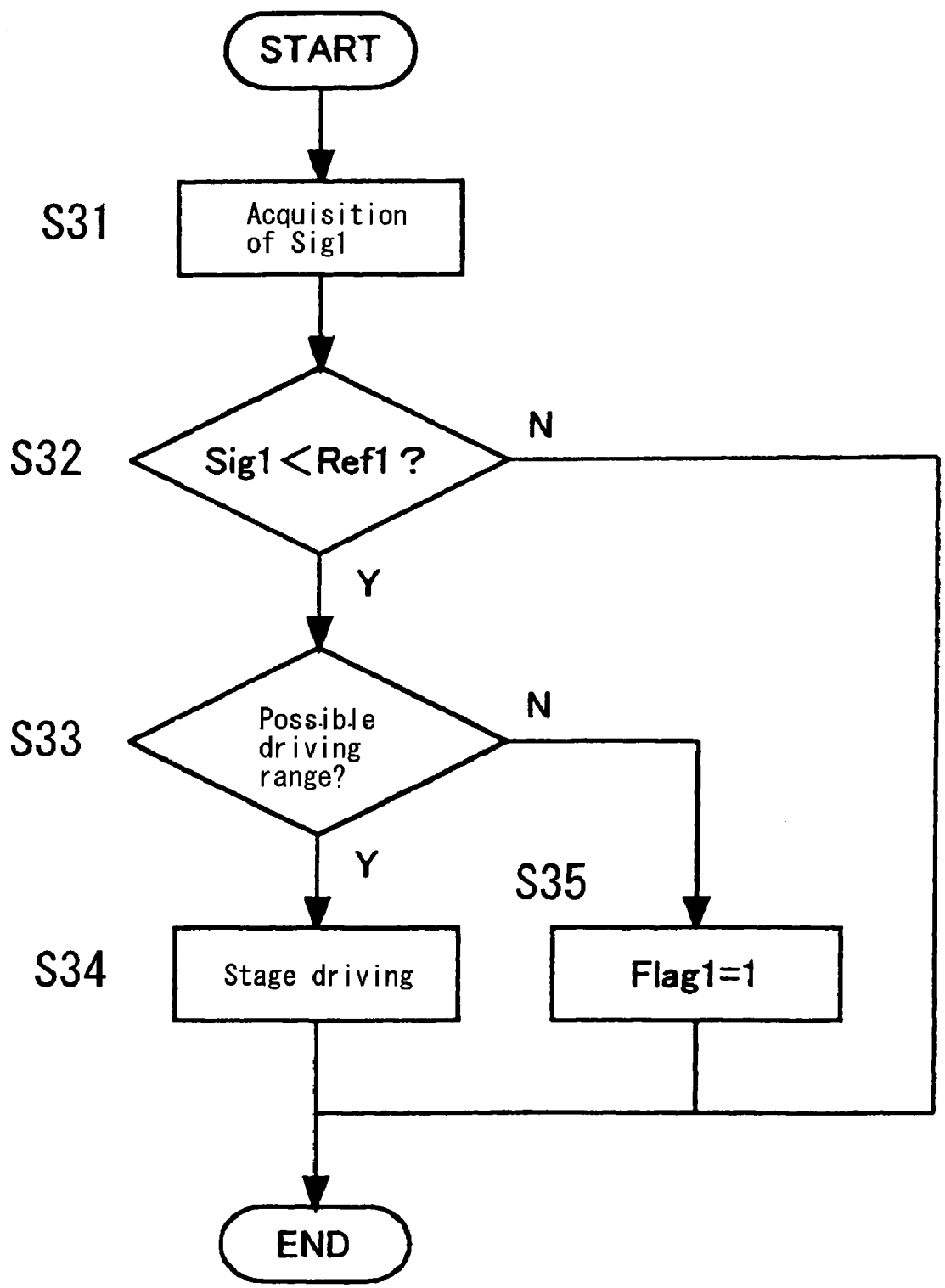
FIG. 9 is a flow chart which shows the algorithm of processing 3 in FIG. 6.

In the algorithm of the processing 3 shown in FIG. 9, the signal value from the optical detector 15 is compared with a value that is stored beforehand, and it is ascertained whether the value is inside or outside the possible driving range. The driving or non-driving of the fourth wave lens holding means 13a and 13b is performed in accordance with the results.

First, in step S31, the value of Sig1 is acquired. Next, in step S32, Sig1 is compared with the set value Ref1 that is stored beforehand. In cases where Sig1<Ref1, it is ascertained in step S33 whether or not the value is inside the possible driving range. If the value is inside the possible driving range, the fourth wave lens holding means 13a and 13b are driven in step S34; after the lenses have been moved, the processing is ended. In cases where the value is outside the possible driving range, Flag1=1 is set in step S35, and the processing is ended. In cases where Sig1 is not less than Ref1 in step S32, the processing is ended "as is."

In the processing 4, since the fourth wave lens holding means 13a and 13b and seventh wave lens holding means 14a and 14b are all outside the possible driving range at this point in time, a notification of this is made, and the main algorithm is ended.

In the embodiment described above, the system is arranged so that the cylindrical lenses are moved when the output from the optical detectors 15 and 16 falls below a predetermined value. However, it would also be possible to arrange the system so that the cylindrical lenses are moved in accordance with the time for which the apparatus has been used. For example, the system may be devised so that the control device 17 ascertains that the apparatus is being used by detecting the output from the optical detectors 15 and 16, and causes the cylindrical lenses to move by a predetermined distance each time that the cumulative use time reaches a predetermined time. Furthermore, the system may also be devised so that position control is applied in such a manner that the amount of movement of the cylindrical lenses is proportional to the cumulative use time of the apparatus.

Figure 10:
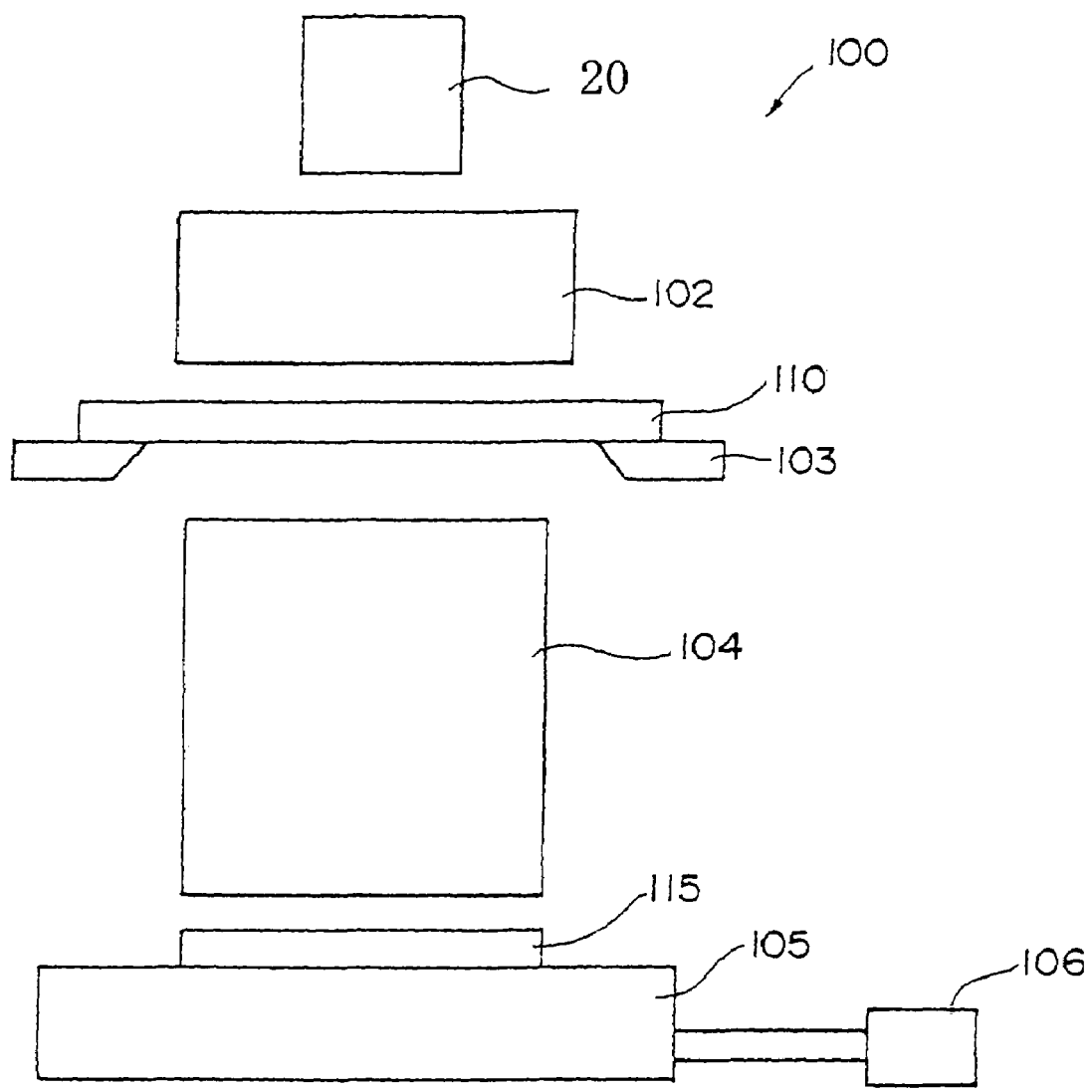
FIG. 10 is a diagram which shows an outline of an exposure apparatus constituting an embodiment of the present invention.

Next, the exposure apparatus 100 which is constructed using the laser device 20 (hereafter referred to as the "laser device") constructed from the fundamental wave generating part 1 and wavelength conversion part 2 described above, and which is used in a photolithographic process constituting one semiconductor manufacturing process, will be described with reference to FIG. 10. In terms of the principle of operation, an exposure apparatus used in a photolithographic process is the same as an apparatus used in photographic platemaking; in this apparatus, a device pattern that is precisely drawn on a photo-mask (reticle) is transferred by optical projection onto a semiconductor wafer, glass substrate, or the like that is coated with a photo-resist. This exposure apparatus 100 is constructed so that the apparatus comprises the laser device 20 described above, an illumination optical system 102, a mask supporting stand 103 that supports the photo-mask (reticle) 110, a projection optical system 104, a carrying stand 105 that carries and holds the semiconductor wafer 115 constituting the object of exposure, and a driving apparatus 106 that causes the carrying stand 105 to move in the horizontal direction.

In this exposure apparatus 100, laser light that is output from the laser device 20 described above is input into the illumination optical system 102, which is constructed from a plurality of lenses, and the entire surface of the photo-mask 110 that is supported on the mask supporting stand 103 is illuminated via this illumination optical system. The light that is transmitted through the photo-mask 110 as a result of this illumination has an image of the device pattern that is drawn on the photo-mask 110; this light is caused to illuminate a predetermined position on the semiconductor wafer 115 that is carried on the carrying stand 105 (with this illumination being accomplished via the projection optical system 104). In this case, the image of the device pattern on the photo-mask 110 is reduced and focused as an image on the semiconductor wafer 115 by the projection optical system 104, so that the wafer is exposed.

Furthermore, the control of the amount of illuminating light in the exposure apparatus can easily be accomplished, for example, by controlling the pulse frequency in the light source part 3, or controlling the output of the excitation light in the excitation light source part 5. Moreover, the on-off control of the laser light can be accomplished by the on-off control of the DFB semiconductor laser in the light source part 3; alternatively, such control can easily be accomplished by installing a modulating element such as an electro-optical modulating element and acoustic-optical modulating element somewhere on the optical path, or installing a mechanical shutter. Accordingly, in the exposure apparatus described above, the characteristics of a compact, light-weight ultraviolet light source with a high degree of freedom in disposition can be utilized to obtain a compact exposure apparatus with good maintenance characteristics and operating characteristics.

In the ultraviolet light source of the present invention, as was described above, a single mode fiber laser is used as the excitation light source of the fiber optical amplifier; accordingly, an ultraviolet light source that achieves both a high peak power and a high mean output can be provided using a simple apparatus construction.

Figure 11:
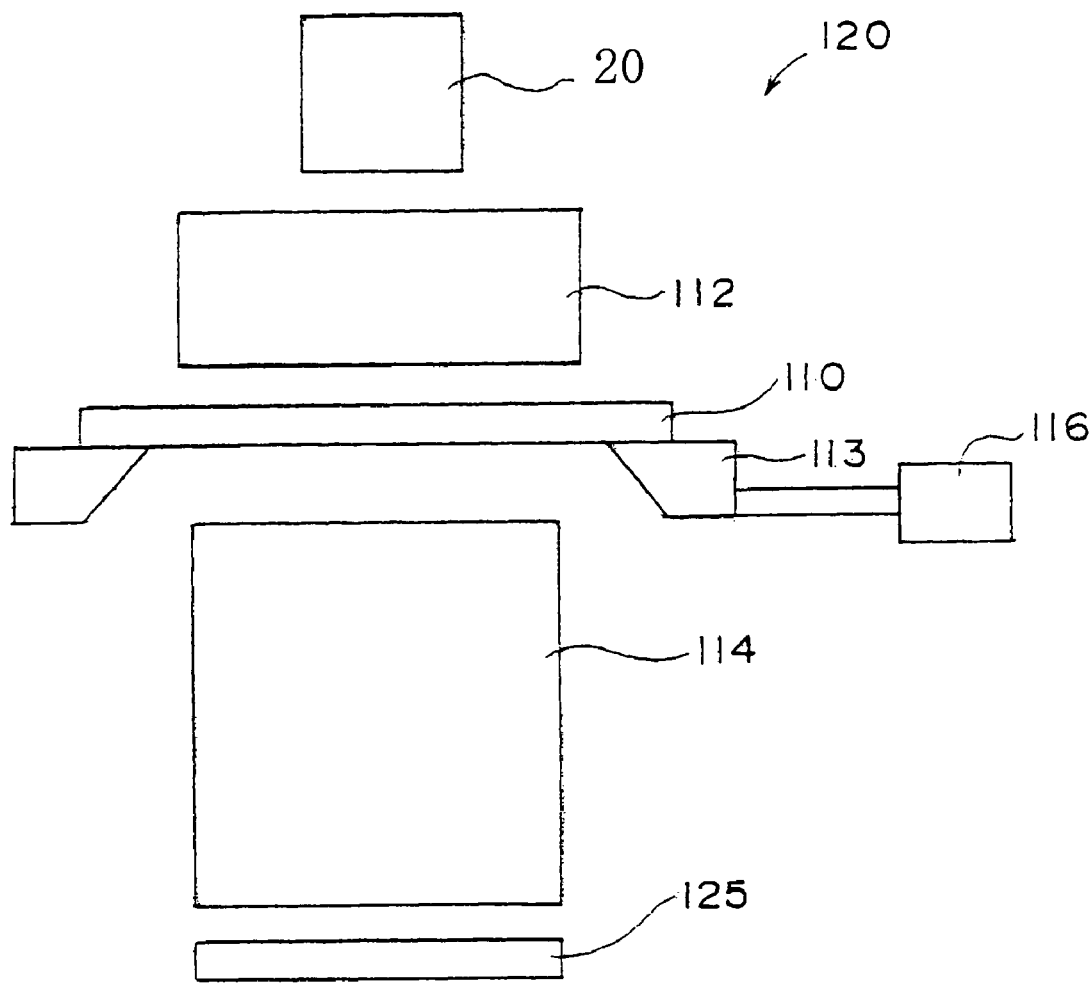
FIG. 11 is a diagram which shows an outline of a mask inspection device constituting an embodiment of the present invention.

Next, the mask defect inspection device constructed using the laser device 20 of the present invention described above will be described below with reference to FIG. 11. This mask inspection device optically projects the device pattern that is precisely drawn on the photo-mask onto a TDI sensor (time delay and integration), compares the sensor image with a predetermined reference image, and extracts pattern defects from the difference. The mask defect inspection device 120 is constructed so that this device comprises the laser device 20 described above, an illumination optical system 112, a mask supporting stand 113 that supports the photo-mask 110, a driving apparatus 116 that drives the mask supporting stand in the horizontal direction, a projection optical system 114, and a TDI sensor 125. In this mask defect inspection device 120, laser light that is output from the laser device 20 described above is input into the illumination optical system 112, which is constructed from a plurality of lenses, and passes through this system so that this light is caused to illuminate a predetermined region on the photo-mask 110 supported on the mask supporting stand 113. The light that passes through the photo-mask 110 as a result of this illumination has an image of the device pattern that is drawn on the photo-mask 110; this light is focused as an image in a predetermined position on the TDI sensor 125 via the projection optical system 114. Furthermore, the horizontal movement speed of the mask supporting stand 113 is synchronized with the transfer clock of the TDI 125.

Figure 12:
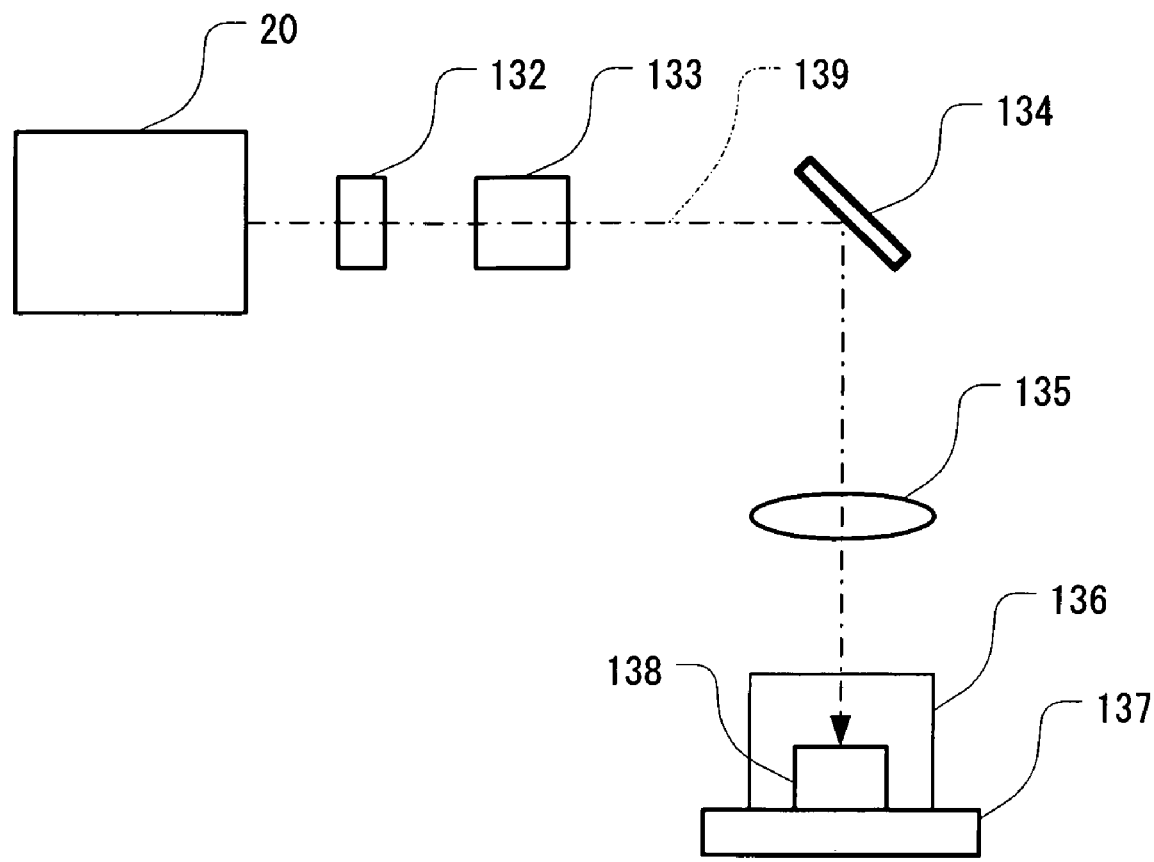
FIG. 12 is a diagram which shows an outline of a macromolecular crystal working apparatus constituting an embodiment of the present invention.

FIG. 12 is a schematic diagram of a macromolecular crystal working apparatus that is constructed using the laser device 20 of the present invention. Here, ultraviolet short-pulse laser light 139 emitted from the laser device 20 is focused and directed onto a macromolecular crystal 138 placed inside a sample container 136 via a shutter 132, an intensity adjusting element 133, an illumination position control mechanism 134 and a focusing optical system 135. The sample container 136 is mounted on a stage 137, and is arranged so that three-dimensional movement is possible along the x axis, y axis and z axis in an x-y-z orthogonal coordinate system with the direction of the optical axis taken as the z axis, and so that rotation about the z axis is also possible. Working of the macromolecular crystal is performed by the laser light that is focused and directed onto the surface of the macromolecular crystal 138.

Incidentally, in cases where an object of working that consists of a macromolecular crystal is worked, it is necessary to confirm the location on the object of working that is illuminated with the laser light. However, since laser light is usually not visible light, visual inspection is impossible; accordingly, use in combination with an optical microscope is desirable.

Figure 13:
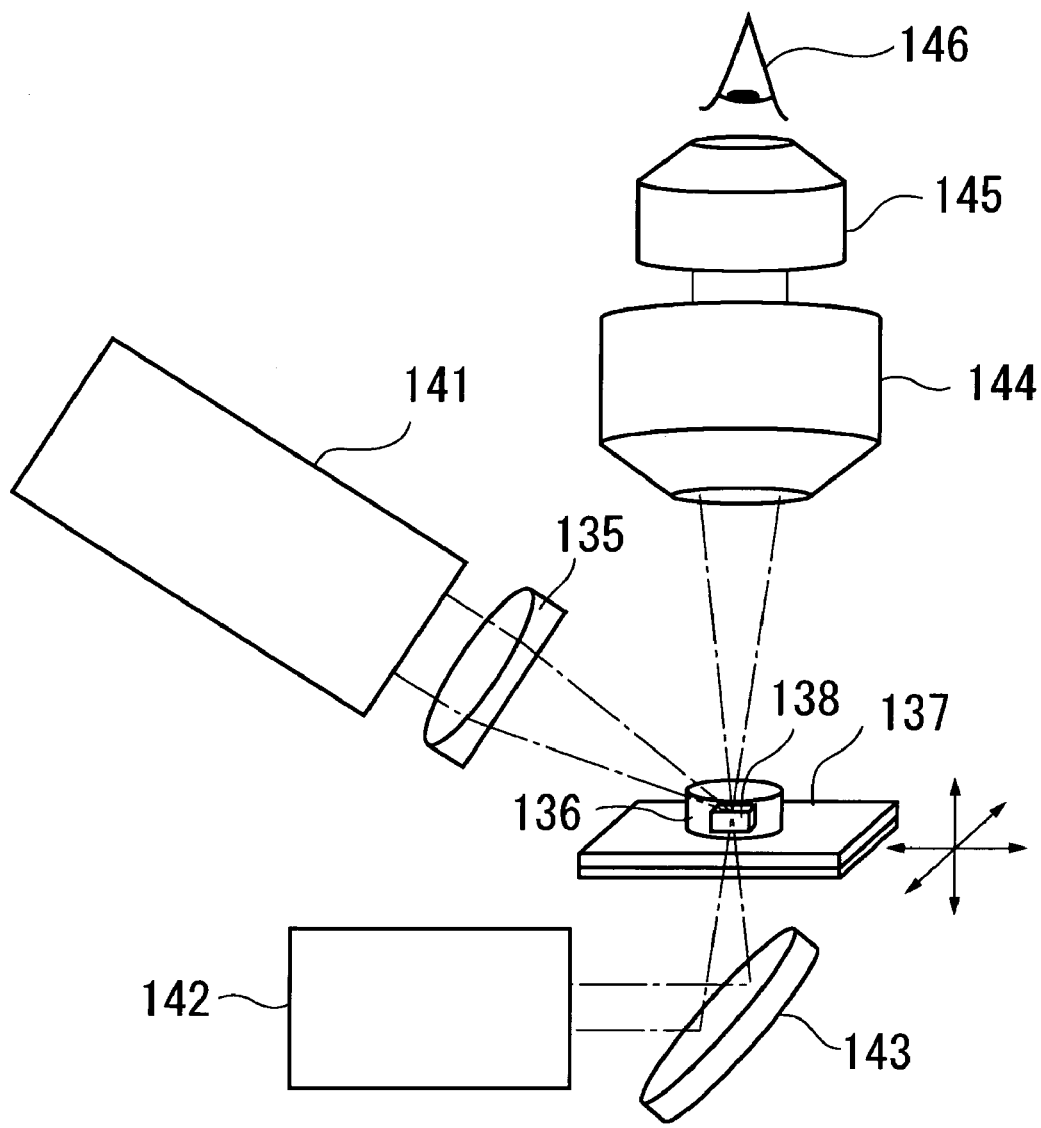
FIG. 13 is a diagram showing a state in which a macromolecular crystal working apparatus constituting an embodiment of the present invention is combined with an optical microscope.

FIG. 13 shows an example of this. In the optical system shown in FIG. 13 (a), laser light from an ultraviolet short-pulse laser system 141 (corresponding to the symbols 20 and 132 through 134 in FIG. 12) is focused on a predetermined point via the focusing optical system 135. The stage 137 has the function illustrated in FIG. 12; the sample container 136 containing the macromolecular crystal 138 is placed on the stage 137. Visible light from the illuminating light source 142 is reflected by the reelecting mirror 143, and illuminates the sample container 136 by Koehler illumination. The macromolecular crystal 138 is visually inspected by the eye 146 via the object lens 144 and ocular lens 145 of an optical microscope.

A cruciform mark is formed in the position of the optical axis of the optical microscope, so that the optical axis position can be inspected by visual inspection. Furthermore, the focal position of the optical microscope (focusing position, i.e., object plane where the focus is formed during visual inspection) is fixed. The system is devised so that the laser light that is focused by the focusing optical system 135 is focused at the optical axis position of the optical microscope, and also at the focal position of the optical microscope. Accordingly, in cases where the object of working is placed on the stage 137, and an image of this object of working is observed with the optical microscope, the image is in focus, and the system is arranged so that the laser light from the laser system 141 is focused at a position in the center of the cruciform mark. Furthermore, the relative positional relationship of the laser system 141, focusing optical system 135 and optical microscope is fixed; only the stage 137 is made movable in relative terms with respect to these fixed systems.

Accordingly, it is possible to work a desired location, and to accomplish the working of a desired shape, by performing working while moving the stage 137 so that the location where it is desired to perform working is located at the optical axis position and focal position of the optical microscope. If it is desired to perform working automatically, this can be accomplished by attaching an automatic focus adjustment device to the optical microscope, driving the stage 137 in accordance with commands from this automatic focus adjustment device, and performing this driving of the stage 137 so that a predetermined predetermined portion of the stage 137 is located on the optical axis of the optical microscope. Alternatively, it would also be possible to align a reference position initially, and then drive the stage 137 in two dimensions or three dimensions by means of a servo mechanism.

The invention claimed is:

1. An optical element comprising a plurality of cylindrical lenses which are disposed so that respective generatrix directions of the lenses cross each other so as to generate a lens action;
   wherein each of the lenses is movable in the respective generatrix direction thereof.

2. The optical element according to claim 1, wherein the cylindrical lenses are formed from one of fuzed silica glass and calcium fluoride.

3. An optical system comprising:
the optical element according to claim 1; and
a control device that detects light that is transmitted through the optical element, and that moves the cylindrical lenses by a predetermined distance in the respective generatrix directions when a detected value of the light is not more than a predetermined value.

4. A laser device comprising:
a laser light source; and
a wavelength conversion element that converts a wavelength of laser light that is output from the laser light source,
wherein the laser light is focused on the wavelength conversion element by the optical system according to claim 3.

5. An exposure apparatus comprising:
the laser device according to claim 4;
a mask supporting part that holds a photo-mask on which a predetermined exposure pattern is formed;
an object holding part that holds an object of exposure;
an illumination optical system that illuminates the photo-mask held by the mask supporting part with ultraviolet light that is emitted from the laser device; and
a projection optical system that illuminates the object of exposure held by the object holding part with the illuminating light that has passed through the photo-mask after illuminating the photo-mask via the illumination optical system.

6. A mask inspection device comprising:
the laser device according to claim 4;
a mask supporting part that holds a photo-mask on which a predetermined pattern is formed;
a detector that detects a projected image of the pattern;
an illumination optical system that illuminates the photo-mask held by the mask supporting part with ultraviolet light that is emitted from the laser device; and
a projection optical system that projects onto the detector the illuminating light which has passed through the photo-mask after illuminating the photo-mask via the illumination optical system.

7. A macromolecular crystal working apparatus which works a macromolecular crystal, said apparatus comprising:
the laser device according to claim 4;
an optical system which conducts laser light that is emitted from the laser device to the macromolecular crystal, and which focuses the laser light on a working site of the macromolecular crystal; and
a mechanism which varies relative positions of the optical system and the macromolecular crystal.

8. The macromolecular crystal working apparatus according to claim 7, further comprising one of: (i) an observation device that simultaneously observes a position where the laser light is focused and the macromolecular crystal, and (ii) a measurement device that simultaneously measures the position where the laser light is focused and the macromolecular crystal.

9. The macromolecular crystal working apparatus according to claim 8, wherein the observation device or measurement device is an optical observation device or optical measurement device using visible light, and is in a fixed mechanical relationship with the optical system, and a position of a reference point of the observation device or measurement device and the position where the laser light is focused coincide; and wherein the macromolecular crystal working apparatus is adapted to observe or measure indirectly the position where the laser light is focused by observing or measuring the position of the reference point.

10. An optical system comprising:
the optical element according to claim 1; and
a control device that moves the cylindrical lenses by a predetermined distance in the respective generatrix directions each time that a length of time that the optical element is used exceeds a predetermined time.

11. An optical system comprising:
the optical element according to claim 1; and
a control device that continuously moves the cylindrical lenses in the respective generatrix directions in accordance with a length of time for which the optical element is used.

12. A laser devic comprising:
a laser light sources; and
a wavelength conversion element that converts a wavelength of laser light that is output from the laser light source,
wherein the laser light is focused on the wavelength conversion element by the optical element according to claim 1.

13. An exposure apparatus comprising:
the laser device according to claim 12;
a mask supporting part that supports a photo-mask on which a predetermined exposure pattern is formed;
an object holding part that holds an object of exposure;
an illumination optical system that illuminates the photo-mask held by the mask supporting part with ultraviolet light that is emitted from the laser devices; and
a projection optical system that illuminates the object of exposure held by the object holding part with the illuminating light that has passed through the photo-mask after illuminating the photo-mask via the illumination optical system.

14. A mask inspection device comprising:
the laser device according to claim 12;
a mask supporting part that holds a photo-mask on which a predetermined pattern is formed;
a detector that detects a projected image of the pattern;
an illumination optical system that illuminates the photo-mask held by the mask supporting part with ultraviolet light that is emitted from the laser device; and
a projection optical system that projects onto the detector the illuminating light which has passed through the photo-mask after illuminating the photo-mask via the illumination optical system.

15. A macromolecular crystal working apparatus which works a macromolecular crystal, said apparatus comprising:
the laser device according to claim 12
an optical system which conducts laser light that is emitted from the laser device to the macromolecular crystal, and which focuses the laser light on a working site of the macromolecular crystals; and
a mechanism which varies relative positions of the optical system and the macromolecular crystal.

16. The macromolecular crystal working apparatus according to claim 15, further comprising one of: (i) an observation device that simultaneously observes a position where the laser light is focused and the macromolecular crystal, and (ii) a measurement device that simultaneously measures the position where the laser light is focused and the macromolecular crystal.

17. The macromolecular crystal working apparatus according to claim 16, wherein the observation device or measurement device is an optical observation device or optical measurement device using visible light, and is in a fixed mechanical relationship with the optical system, and a position of a reference point of the observation device or measurement device and the position where the laser light is focused coincide; and wherein the macromolecular crystal working apparatus is adapted to observe or measure indirectly the position where the laser light is focused by observing or measuring the position of the reference point.

18. The optical element according to claim 1, wherein the plurality of cylindrical lenses comprise two cylindrical lenses which are disposed so that the generatrices thereof are perpendicular to each other.

* * * * *